United States Patent
Ito

(10) Patent No.: US 9,383,828 B2
(45) Date of Patent: Jul. 5, 2016

(54) INPUT DEVICE

(71) Applicant: Onkyo Corporation, Osaka (JP)

(72) Inventor: Kazunari Ito, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 14/549,031

(22) Filed: Nov. 20, 2014

(65) Prior Publication Data

US 2015/0153839 A1 Jun. 4, 2015

(30) Foreign Application Priority Data

Dec. 3, 2013 (JP) ................. 2013-250025

(51) Int. Cl.
*G06F 3/023* (2006.01)
*G06F 3/02* (2006.01)
*H03M 11/24* (2006.01)

(52) U.S. Cl.
CPC .............. *G06F 3/023* (2013.01); *G06F 3/0202* (2013.01); *H03M 11/24* (2013.01)

(58) Field of Classification Search
CPC ...... G06F 3/023; G06F 3/0202; H03M 11/24; H01H 13/70
See application file for complete search history.

(56) References Cited

U.S. PATENT DOCUMENTS

| | | | |
|---|---|---|---|
| 7,391,342 B1 | 6/2008 | Mui | |
| 7,391,343 B2 | 6/2008 | Ito | |
| 7,978,098 B2 | 7/2011 | Kato | |
| 2010/0090746 A1* | 4/2010 | Nakada | H03M 11/24 327/365 |

FOREIGN PATENT DOCUMENTS

| | | |
|---|---|---|
| JP | 06-124155 H | 5/1994 |
| JP | 07-271493 | 10/1995 |
| JP | 07-302150 | 11/1995 |
| JP | 2002-367254 | 12/2002 |
| JP | 2005-149223 | 6/2005 |
| JP | 2005-266843 | 9/2005 |
| JP | 2007-323295 | 12/2007 |
| JP | 2011-113352 | 6/2011 |

OTHER PUBLICATIONS

Japanese Decision to Grant with translation to corresponding Japanese Application No. 2013-250025 mailed Apr. 7, 2015.
Japanese Office Action with translation to corresponding Japanese Application No. 2013-250025 mailed Feb. 3, 2015.

* cited by examiner

*Primary Examiner* — Kevin M Nguyen
(74) *Attorney, Agent, or Firm* — Renner, Otto, Boisselle & Sklar, LLP

(57) ABSTRACT

There is provided an input device that needs not to change processing of means (a key processor or a key processing microcomputer as a software module) for performing processing based on an on or off state of a key switch in a matrix system and an A/D system. A key-in microcomputer detects the on or off states of plural key switches K based on voltages at A/D input terminals. The key-in microcomputer converts the detected on or off states of the plural key switches K into a bit array. A key processing microcomputer performs the processing based on the bit array converted by the key-in microcomputer.

3 Claims, 14 Drawing Sheets

Fig. 3

| Key switch (x = 1 to 4) | Voltage (A/D-converted value) | Threshold | Key number |
|---|---|---|---|
| Not available | V | 0.875(V)～V | 0 |
| Kx4 | 0.75(V) | 0.625～0.875(V) | 4 |
| Kx3 | 0.50(V) | 0.375～0.625(V) | 3 |
| Kx2 | 0.25(V) | 0.125～0.375(V) | 2 |
| Kx1 | 0(V) | 0～0.125(V) | 1 |

Fig. 12  CONVENTIONAL ART

| Key switch (x = 1 to 4) | Voltage | Threshold |
|---|---|---|
| Not available | V | 0.875(V)～V |
| Kx4 | 0.75(V) | 0.625～0.875(V) |
| Kx3 | 0.50(V) | 0.375～0.625(V) |
| Kx2 | 0.25(V) | 0.125～0.375(V) |
| Kx1 | 0(V) | 0～0.125(V) |

INPUT DEVICE

BACKGROUND OF THE INVENTION

1. Field of the Invention

The present invention relates to an input device incorporated in electronic instruments such as AV equipment and a personal computer.

2. Description of the Related Art

FIG. 9 is a block diagram illustrating a configuration of a conventional input device. As illustrated in FIG. 9, an input device 100 includes plural keys (not illustrated), plural key switches K that is put into an on state by pressing the plural keys, a microcomputer 101 (hereinafter, referred to as a "key-in microcomputer") that detects and outputs the on or off state of the key switch K, and a microcomputer 102 (hereinafter, referred to as a "key processing microcomputer") that performs processing based on information output from the key-in microcomputer 101. In the personal computer (hereinafter, referred to as a "PC"), the key switch K and the key-in microcomputer 101 are provided in a keyboard, and the key processing microcomputer 102 is provided in a PC main body. In the AV equipment, the key switch K and the key-in microcomputer 101 are provided in a panel, and the key processing microcomputer 102 is provided in a rear portion of the panel (a chassis of the AV equipment). At this point, by way of example, the key-in microcomputer 101 and the key processing microcomputer 102 are independent of each other. Alternatively, one microcomputer may perform the processing performed by the key-in microcomputer 101 and the processing performed by the key processing microcomputer 102. That is, the on or off state of the key switch K is detected by an independent programs may cause one microcomputer to act as a key-in unit (software module) that detects and outputs the on or off state of the key switch K and a key processor (software module) that performs the processing based on information output from the key-in unit, and the key-in unit and the key processor may exchange an instruction and information through inter-module communication.

In a conventional input device, which key is pressed is detected using a system called a matrix system (for example, see Japanese Patent Publication Laid-Open No. 6-124155) or a system called an A/D system (for example, see Japanese Patent Publication Laid-Open No. 2005-266843). FIG. 10 is a view illustrating the matrix system. The key-in microcomputer 101 includes plural input terminals 103 to 106 and plural output terminals 107 to 110. Key switches K11, K12, K13, and K14 are connected to the first input terminal 103, key switches K21, K22, K23, and K24 are connected to the second input terminal 104, key switches K31, K32, K33, and K34 are connected to the third input terminal 105, and key switches K41, K42, K43, and K44 are connected to the fourth input terminal 106. The key switches K11, K21, K31, and K41 are connected to the first output terminal 107, the key switches K12, K22, K32, and K42 are connected to the second output terminal 108, the key switches K13, K23, K33, and K43 are connected to the third output terminal 109, and the key switches K14, K24, K34, and K44 are connected to the fourth output terminal 110. A power supply V1 is connected to the key switches K11 to K14 through a resistor R1, connected to the key switches K21 to K24 through a resistor R2, connected to the key switches K31 to K34 through a resistor R3, and connected to the key switches K41 to K44 through a resistor R4.

Usually, the key-in microcomputer 101 sets voltages at the output terminals 107 to 110 to a high level. In the case that the on or off states of the key switches K11 to K41 are detected, the key-in microcomputer 101 sets the first output terminal 107 to a low level. For example, in the case that the voltage at the first output terminal 107 is set to the low level, the voltage at the first input terminal 103 becomes the low level when the key switch K11 is put into the on state (when the key is pressed). Therefore, the key-in microcomputer 101 can detect the on state of the key switch K11 in the case that the voltage at the first input terminal 103 is in the low level. In the case that the voltage at the first output terminal 107 is set to the low level, the voltage at the first input terminal 103 becomes the high level by the resistor R1 connected to the power supply V1 when the key switch K11 is in the off state (when the key is not pressed). Therefore, the key-in microcomputer 101 can detect the off state of the key switch K11 in the case that the voltage at the first input terminal 103 is in the high level. Similarly, the key-in microcomputer 101 can detect the on or off states of the key switches K21, K31, and K41 from the voltage levels of the second input terminal 104, the third input terminal 105, and the fourth input terminal 106. Even if another key switch except the key switches K11 to K41 is pressed, because the first output terminal 107 is provided independently of the output terminals 108 to 110, the key-in microcomputer 101 can detect the on or off states of the key switches K11 to K41 without being influenced by the states of other key switches.

The key-in microcomputer 101 can detect the on or off states of the key switches K12 to K42 by setting the voltage at the second output terminal 108 to the low level, detect the on or off states of the key switches K13 to K43 by setting the voltage at the third output terminal 109 to the low level, and detect the on or off states of the key switches K14 to K44 by setting the voltage at the fourth output terminal 110 to the low level.

In the matrix system, the on or off states of all the key switches can individually be detected. For this reason, the matrix system is frequently adopted in the PC because sometimes the plural keys are simultaneously pressed in the PC by fast typing and because the PC includes keys, such as a shift key and a ctrl key, which are subject to the simultaneous pressing. After detecting which key switch K is in the on state, the key-in microcomputer 101 converts the detected key switch K that is in the on state into a unique key ID or key code, and outputs the converted key ID or key code to the key processing microcomputer 102.

In the case that the plural key switches K are simultaneously in the on state, the key-in microcomputer 101 converts the key switches K into various key IDs according to the key switches K that are in the on state. For example, it is assumed that keys "r", "u", and "n" are sequentially pressed, and it is assumed that finally the key switches K corresponding to the keys "r", "u", and "n" are simultaneously put into the on state. In this case, the key-in microcomputer 101 converts the key switches K into the key IDs corresponding to "r", "u", and "n", and the key-in microcomputer 101 sequentially outputs the converted key IDs corresponding to "r", "u", and "n" to the key processing microcomputer 102 although the three key switches K are simultaneously put into the on state. The key processing microcomputer 102 can determine the pressing of a "run" key by the key IDs corresponding to "r", "u", and "n", which are output from the key-in microcomputer 101. On the other hand, for example, in the case that the shift key and the key "r" are simultaneously pressed to put the key switches corresponding to the shift key and the "r" key into the on state, the key-in microcomputer 101 converts the key switches into the key ID corresponding to "R" and outputs the converted key ID to the key processing microcomputer 102, or the key-in microcomputer 101 converts the key switches into the key ID corresponding to "r" and outputs the converted key ID to the key processing microcomputer 102 together with information indicating that the shift key is in the on state.

In the matrix system, because the key-in microcomputer 101 converts into the different key ID according to the key switch K (a function or a character of the pressed key) put into the on state, sometimes the key processing microcomputer 102 can hardly determine that the plural key switches K are simultaneously put into the on state. In the PC, the matrix system is frequently adopted because a user does not bother during such usual use that a character is input.

However, in a special application (for example, in a gaming PC) of the PC, the key processing microcomputer 102 needs to determine whether the plural key switches K are simultaneously put into the on state. In such cases, the key-in microcomputer 101 does not convert the key switch K put into the on state into the corresponding key ID, but converts the on or off state of the key switch K into a bit value in which a value of 1 is the on state while a value of 0 is the off state. The key-in microcomputer 101 collects the states (1 or 0) of all the key switches K or the necessary key switches K to form a bit array, and outputs the bit array to the key processing microcomputer 102. For example, in reference to FIG. 10, when the key switch K21 is in the on state in the 16 key switches K11 to K41, the key-in microcomputer 101 sets an element b(2,1) of the bit array to 1. When the key switch K42 is in the on state, the key-in microcomputer 101 sets an element b(4,2) of the bit array to 1. The key-in microcomputer 101 outputs elements b(1,1) to b(4,4) of the bit array corresponding to the states of the key switches K11 to K44 to the key processing microcomputer 102.

FIG. 11 is a view illustrating the A/D system. The A/D system is frequently adopted in AV equipment and home electric appliances. The key-in microcomputer 101 includes plural A/D input terminals 111 to 114. The key switches K11, K12, K13, and K14 are connected to the first A/D input terminal 111, key switches K21, K22, K23, and K24 are connected to the second A/D input terminal 112, key switches K31, K32, K33, and K34 are connected to the third A/D input terminal 113, and key switches K41, K42, K43, and K44 are connected to the fourth A/D input terminal 114. The power supply V1 (voltage V) is connected to the key switches K11 to K14 through a resistor R11, connected to the key switches K21 to K24 through a resistor R21, connected to the key switches K31 to K34 through a resistor R31, and connected to the key switches K41 to K44 through a resistor R41. In order to divide the voltage, resistors R12, R13, and R14 are connected between the key switch K11 and the key switch K12, the key switch K12 and the key switch K13, and the key switch K13 and the key switch K14, respectively. Similarly to the key switches K11 to K14, resistors R22 to R24, R32 to R34, and R42 to R44 are connected in the key switches K21 to K24, K31 to K34, and K41 to K44. The key switches K11 to K44 are grounded.

At this point, in order that the key switches K in the on state and the voltages at the A/D input terminals 111 to 114 exhibit a relationship in FIG. 12, resistors having proper resistances are used as the resistors R11 to R14, R12 to R42, R13 to R43, and R14 to R44 for the purpose of the voltage dividing. As illustrated in FIG. 12, the key switch K and a threshold are stored in the key-in microcomputer 101 while correlated with each other. For example, in the case that the voltage at the first A/D input terminal 111 becomes 0.50 V, the key-in microcomputer 101 determines that the voltage at the first A/D input terminal 111 falls within a range of the threshold of 0.375 to 0.625 V. The key-in microcomputer 101 detects the on state of the key switch K13 corresponding to the threshold of 0.375 to 0.625 V. Thus, the key-in microcomputer 101 can determine which range of the threshold the voltages at the A/D input terminals 111 to 114 fall within, and detect which key switch K is in the on state. Preferably a difference in voltage between in the case the key switches K adjacent to each other are in the on state and in the case other key switches K adjacent to each other are in the on state becomes an equal interval (in FIG. 12, 0.25 V). This is because the voltage falls surely within the range of the threshold to prevent a false detection.

In the A/D system, in the case that the plural key switches K connected to the identical A/D terminal are simultaneously in the on state, sometimes the key-in microcomputer 101 can hardly detect which key switch K is put into the on state. For example, as illustrated in FIG. 13(a), the key switch K13 connected to the first A/D input terminal 111 is put into the on state after the key switch K11 connected to the first A/D input terminal 111 is put into the on state. In this case, as illustrated in FIG. 13(b), the voltage at the first A/D input terminal 111 becomes zero when the key switch K11 is put into the on state in first, and the voltage at the first A/D input terminal 111 is not changed but remains in zero even if the key switch K13 is put into the on state. Therefore, the key-in microcomputer 101 can hardly detect that the key switch K11 and the key switch K13 are simultaneously put into the on state. That is, when the key switch K, which is connected to the A/D input terminal (key-in microcomputer 101) while located closer to (on the nearer side of) the A/D input terminal, is put into the on state in first in the plural key switches K connected to the identical A/D input terminal, the key-in microcomputer 101 can hardly detect the state of the key switch K, which is connected to the A/D input terminal (key-in microcomputer 101) while located farther away from the A/D input terminal with respect to the key switch K located closer to the A/D input terminal.

For example, as illustrated in FIG. 14(a), in the case that the key switch K11 connected to the first A/D input terminal 111 is put into the on state after the key switch K13 connected to the first A/D input terminal 111 is put into the on state, the key-in microcomputer 101 can detect that the key switch K13 and the key switch K11 are simultaneously put into the on state. When the key switch K13 is put into the on state, the voltage at the first A/D input terminal 111 becomes 0.5 V as illustrated in FIG. 14 (b). The key-in microcomputer 101 determines that the voltage at the first A/D input terminal 111 falls within the range of the threshold of 0.375 V to 0.625 V. The key-in microcomputer 101 detects the on state of the key switch K13 corresponding to the threshold of 0.375 to 0.625 V. Then, when the key switch K11 is put into the on state, the voltage at the first A/D input terminal 111 becomes 0 V as illustrated in FIG. 14 (b). The key-in microcomputer 101 determines that the voltage at the first A/D input terminal 111 falls within the range of the threshold of 0 V to 0.125 V. The key-in microcomputer 101 detects the on state of the key switch K11 corresponding to the threshold of 0 V to 0.125 V.

In the A/D system, similarly to the matrix system, the key-in microcomputer 101 converts the key switch K put into the on state into the key ID or the key code, and outputs the key ID or the key code to the key processing microcomputer 102. The key-in microcomputer 101 outputs an A/D-converted value that is of A/D conversion of the voltage to the key processing microcomputer 102 so that the key-in microcomputer 101 can output the on or off state of any key switch K to the key processing microcomputer 102 within the range of a limitation of the A/D system.

In the matrix system, there is an advantage that the on or off states of all the key switches K can be detected. On the other hand, in the matrix system, there is a disadvantage that the numbers of input terminals and output terminals of the key-in microcomputer are increased with increasing number of key switches (keys). In the A/D system, there is an advantage that the number of key switches can be increased without increasing number of A/D input terminals by connecting many key switches to one A/D input terminal. On the other hand, in the A/D system, there is a disadvantage that there is a key switch combination in which the on state of the key switch can hardly be detected when the plural key switches are simultaneously put into the on state.

Thus, in the matrix system and the A/D system, there are the conflicting advantage and disadvantage. Therefore, in the input device, one of the matrix system and the A/D system is selected and used according to the purpose. For the AV equipment and home electric appliances, in the case that a current model is changed to a next model, sometimes the array of the key switches is changed (redesign) while a board on which the key switches are mounted remains. Preferably, in order that the key processing microcomputer can determine that the plural key switches are put into the on state, the key-in microcomputer outputs not the key ID but the bit array to the key processing microcomputer in the matrix system, and the key-in microcomputer outputs not the key ID but the A/D-converted value to the key processing microcomputer in the A/D system.

However, when the bit array is output to the key processing microcomputer in the matrix system, or when the A/D-converted value is output to the key processing microcomputer in the A/D system, the processing of the key processing microcomputer, namely, a program executed by the key processing microcomputer needs to be changed according to the matrix system and the A/D system because the information output to the key processing microcomputer varies.

SUMMARY OF THE INVENTION

An object of the present invention is to provide an input device that needs not to change the processing of means (a key processor or a key processing microcomputer as a software module) for performing the processing based on the on or off state of the key switch in the matrix system and the A/D system.

An input device comprising: a plurality of key switches in each of which one end is connected to a terminal while the other end is grounded; a first resistor in which one end is connected between the terminal and the key switch while the other end is connected to a power supply, the key switch beings connected to the terminal while located closest to the terminal in the plurality of key switches; a plurality of second resistors each of which is connected between the two key switches adjacent to each other in the plurality of key switches; a key-in unit that detects an on or off states of each of the plurality of key switches based on voltage at the terminal, and converts the detected on or off state of each of the plurality of key switches into a bit array; and a key processor that performs processing based on the bit array converted by the key-in unit.

In the present invention, in an input device of a system which is called the A/D system, a key-in unit detects the on or off states of the plural key switches based on voltage at terminal, and converts the detected on or off states of the plural key switches into a bit array. A key processor performs processing based on the bit array converted by the key-in unit. Therefore, it is not necessary to change the processing of the key processor even in the matrix-system input device provided with the key-in unit that outputs the bit array.

Preferably, wherein the plurality of the key switches are connected to each of the plurality of the terminals, and the key-in unit converts the one or off states of the plurality of key switches connected to the one terminal into one bit array.

In the present invention, the key-in unit converts the on or off states of the plural key switches connected to one terminal into one bit array. Accordingly, the independent bit array can be produced in each plural key switches connected to one terminal.

Preferably, wherein the key-in unit detects, in the case that the voltage at the terminal changes from voltage at the power supply, the key switch that is put into the on state from the voltage at the terminal, sets an element of the bit array corresponding to the key switch in which the on state is detected to 1, sets an element of the bit array corresponding to the key switch, which is connected to the terminal while located closer to the terminal with respect to the key switch in which the on state is detected, to 0, and sets an element of the bit array corresponding to the key switch, which is connected to the terminal while located farther away from the terminal with respect to the key switch in which the on state is detected, to a previously-converted value, the key-in unit, in the case that the voltage at the terminal is equal to the voltage at the power supply, detects the off states of the plurality of key switches, and converts the on or off states of the plurality of detected key switches into the bit array by converting the elements of the bit array corresponding to all the plurality of key switches in each of which the off state is detected into 0.

In the conventional input device of the A/D system, when the key switch, which is connected to the terminal while located closer to the terminal is put into the on state in first, the key-in unit can hardly detect the on or off state of the key switch, which is connected to the terminal while located farther away from the terminal with respect to the key switch. Therefore, the key-in unit can hardly convert the on or off state of the key switch into the bit array.

In the present invention, the key-in unit sets an element of the bit array corresponding to the key switch in which the on state is detected to 1. The key-in unit sets an element of the bit array corresponding to the key switch, which is connected to the terminal while located closer to the terminal with respect to the key switch in which the on state is detected to 0. The key-in unit sets the element of the bit array corresponding to the key switch, which is connected to the terminal while located farther away from the terminal with respect to the key switch in which the on state is detected to the previously-converted value (for example, the value of 0 for the previously-converted value of 0, and the value of 1 for the previously-converted value of 1). For example, for the four key switches connected to the terminal, the key-in unit sets the element of the bit array corresponding to a second key switch from the terminal to 1 in the case of detecting the on state of the second key switch. The key-in unit sets the element of the bit array corresponding to a first key switch, which is connected to the terminal while located closest to the terminal with respect with the second key switch to 0. The key-in unit sets the elements of the bit array corresponding to third and fourth key switches, which are connected to the terminal while located farther away from the terminal with respect with the second key switch to the previously-converted value, for example, 0 (3rd key switch) and 1 (4th key switch). Thus, the key-in unit converts the on or off states of the four key switches into the bit array "0101". According to the present invention, the on or off state of the key switch can be converted into the bit array in the input device of the A/D system.

BRIEF DESCRIPTION OF THE DRAWINGS

FIG. 3 is a view illustrating the key switch and a corresponding threshold, which are stored in the key-in microcomputer;

FIG. 12 is a view illustrating a key switch and a corresponding threshold that are stored in the key-in microcomputer;

DETAILED DESCRIPTION OF THE PREFERRED EMBODIMENTS

Figure 1:
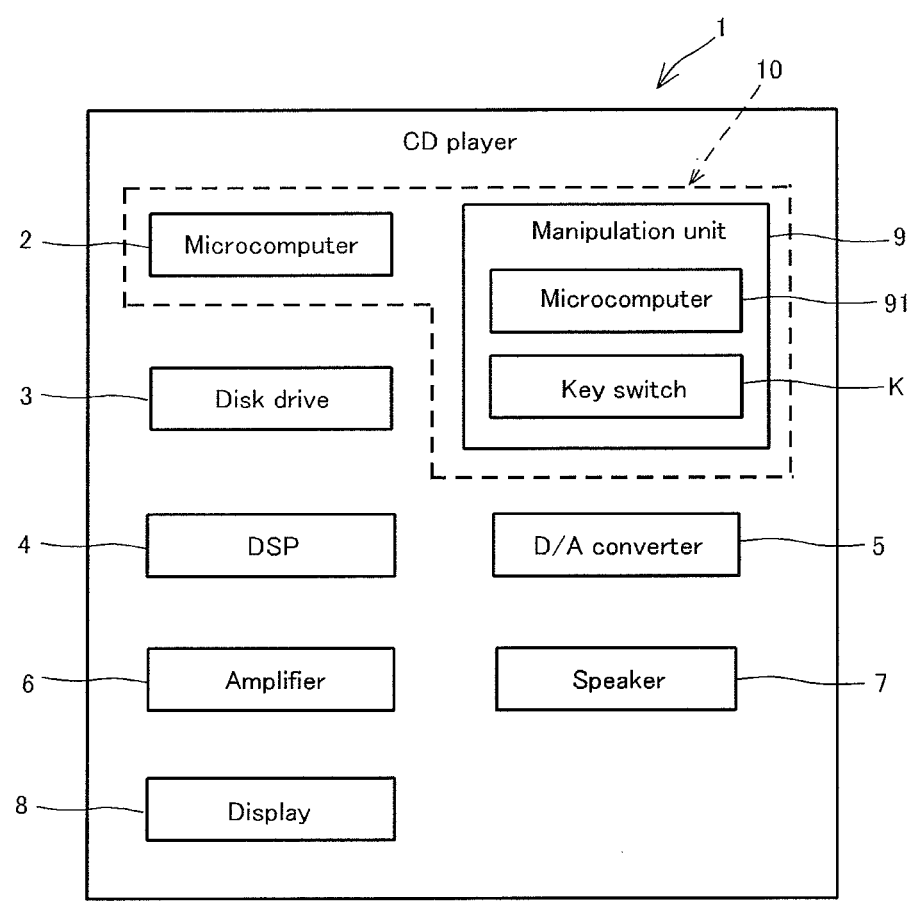
FIG. 1 is a block diagram illustrating a configuration of a CD player according to an embodiment of the present invention.

Hereinafter, an embodiment of the present invention will be described. In the embodiment, by way of example, an input device according to the present invention is applied to a CD player. FIG. 1 is a block diagram illustrating a configuration of the CD player of the embodiment. As illustrated in FIG. 1, a CD player 1 includes a microcomputer (hereinafter, referred to as a "key processing microcomputer") 2, a disk drive 3, a DSP (Digital Signal Processor) 4, a D/A converter 5, an amplifier 6, a speaker 7, a display 8, and a manipulation unit 9. An input device 10 is constructed with the key processing microcomputer 2 and the manipulation unit 9.

The key processing microcomputer 2 (key processor) is constructed with hardware such as a CPU (Central Processing Unit), a ROM (Read Only Memory), a RAM (Random Access Memory), and an input and output interface. The CPU controls each unit constituting the CD player 1 according to a program stored in the ROM. The key processing microcomputer 2 performs processing based on a bit array converted by a microcomputer (to be described).

The disk drive 3 reads data recorded in a CD and outputs the data to the DSP 4. The data read and stopping of the data read of the disk drive 3 are controlled by the key processing microcomputer 2. The DSP 4 decodes the data read by the disk drive 3. The D/A converter 5 converts the data (digital audio signal) output from the DSP 4 into an analog audio signal. The amplifier 6 amplifies the analog audio signal output from the D/A converter 5. The speaker 7 outputs (plays back) the data recorded in the CD as music (audio) based on the analog audio signal output from the amplifier 6. The display 8 displays pieces of information such as a track number and a title of currently playing-back music and current volume. For example, the display 8 is an LCD (Liquid crystal Display) or a fluorescent display tube.

The manipulation unit 9 receives a user's manipulation, and includes a microcomputer (hereinafter, referred to as a "key-in microcomputer") 91 and a key switch K. The key-in microcomputer 91 (key-in unit) is constructed with hardware such as a CPU, a ROM, a RAM, and an input and output interface. The CPU controls the manipulation unit 9 according to a program stored in the ROM. The key switch K is provided according to an operation key provided in a chassis of the CD player 1, and the key switch K is put into an on state by pressing the operation key.

Figure 2:
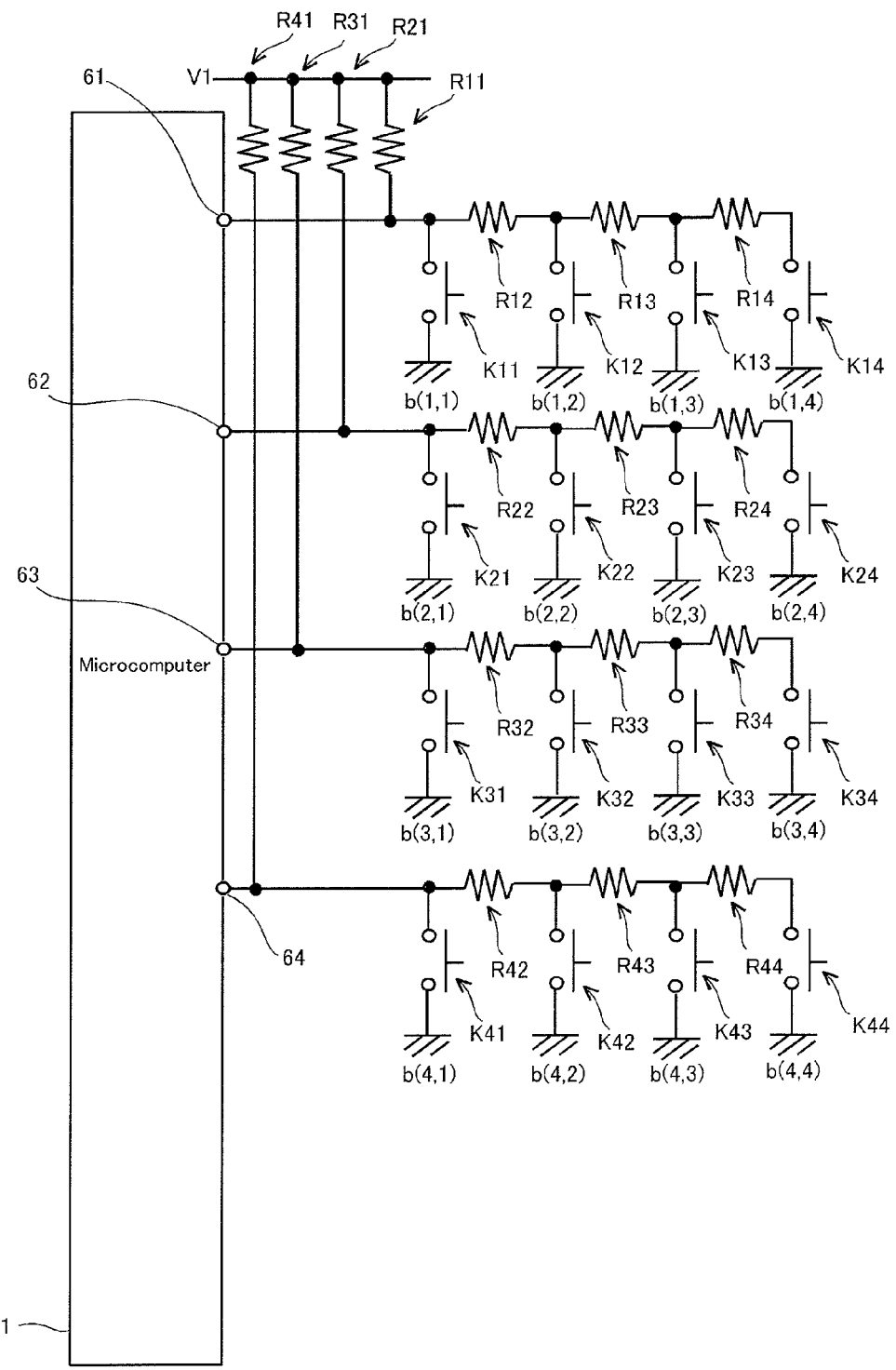
FIG. 2 is a view illustrating connection between a key-in microcomputer and a key switch.

FIG. 2 is a view illustrating connection between the key-in microcomputer 91 and the key switch K. FIG. 2 illustrates the key-in microcomputer 91 including 4-by-4 key switches K11 to K44 and four A/D input terminals 61 to 64 (terminals). In the key switches K11 to K14, one end is connected to the first A/D input terminal 61. In the key switches K11 to K14, the other end is grounded. In the key switches K11 to K14, one end of a resistor R11 (first resistor) is connected between the first A/D input terminal 61 and the key switch K11, which is connected to the first A/D input terminal 61 while located closest to the first A/D input terminal 61. The other end of the resistor R11 is connected to a power supply V1 having voltage V. In the key switches K11 to K14, in order to divide the voltage, resistors R12, R13, and R14 (second resistor) are connected between the key switches K11 and K12, the key switches K12 and K13, and the key switches K13 and K14, respectively. Similarly, the key switches K21 to K24 and resistors R21 to R24 are connected to the second A/D input terminal 62, the key switches K31 to K34 and resistors R31 to R34 are connected to the third A/D input terminal 63, and the key switches K41 to K44 and resistors R41 to R44 are connected to the fourth A/D input terminal 64.

The key-in microcomputer 91 detects the on or off state of the key switch K based on the voltages (A/D-converted value that is of A/D conversion of the voltage) at the A/D input terminals 61 to 64. At this point, in the case that the voltage at the A/D terminal changes from the voltage V at the power supply V1, the key-in microcomputer 91 detects the key switch K put into the on state from the voltages at the A/D input terminals 61 to 64. In the case that the voltages at the A/D input terminals 61 to 64 are equal to the voltage V at the power supply V1, the key-in microcomputer 91 detects that the key switches K connected to the A/D input terminals 61 to 64 are in the off state. Specifically, as illustrated in FIG. 3, the key switch K and a threshold are stored in the key-in microcomputer 91 while correlated with each other. The key-in microcomputer 91 determines whether the voltages at the A/D input terminals 61 to 64 fall within each range of the threshold. The key-in microcomputer 91 detects the on state of the key switch K corresponding to the threshold. At this point, the key-in microcomputer 91 converts the key switch K in which the on state is detected into a corresponding key number. For example, in the case of detecting that the key switch K13 connected to the first A/D input terminal 61 is in the on state, the key-in microcomputer 91 converts the key switch K13 into a key number "3". The key-in microcomputer 91 converts the key switches K11 to K14 into a key number "0" in the case of detecting that the key switches K11 to K14 are in the off state. A method in which the key-in microcomputer 91 detects the on or off state of the key switch K is identical to the conventional detection method, the detailed description is omitted.

The key-in microcomputer 91 converts the detected on or off state of the key switch K into the bit array. At this point, the key-in microcomputer 91 converts the on or off states of the plural key switches K connected to one A/D input terminal into one bit array. That is, the key-in microcomputer 91 converts the key switches K11 to K14 connected to the first A/D input terminal 61 into one bit array b(1,1) to b(1,4). Similarly, the key-in microcomputer 91 converts the on or off states of the key switches K21 to K24 connected to the second A/D input terminal 62, the key switches K31 to K34 connected to the third A/D input terminal 63, the key switches K41 to K44 connected to the fourth A/D input terminal 64 into bit arrays b(2,1) to b(2,4), b(3,1) to b(3,4), and b(4,1) to b(4,4), respectively. The key-in microcomputer 91 collectively outputs the bit arrays b(1,1) to b(4,4) to the key processing microcomputer 2.

Specifically, the key-in microcomputer 91 sets an element of the bit array corresponding to the key switch K in which the on state is detected to 1. The key-in microcomputer 91 sets an element of the bit array corresponding to the key switch K, which is connected to each of the A/D input terminals 61 to 64 while located closer to each of the A/D input terminals 61 to 64 with respect to the key switch K in which the on state is detected to 0. The key-in microcomputer 91 sets the element of the bit array corresponding to the key switch, which is connected to each of the A/D input terminals 61 to 64 while located farther away from each of the A/D input terminals 61 to 64 with respect to the key switch K in which the on state is detected, to a previously-converted value (for example, the value of 0 for the previously-converted value of 0, and the value of 1 for the previously-converted value of 1). For example, in the case that the on or off states of the key switches K11 to K14 connected to the first A/D input terminal 61 are converted into one bit array, the key-in microcomputer 91 sets the element b(1,2) of the bit array corresponding to the key switch K12 to 1 when detecting the on state of the second key switch K12 from the first A/D input terminal 61. The key-in microcomputer 91 sets the element b(1,1) of the bit array corresponding to the first key switch K11, which is connected to the first A/D input terminal 61 while located closer to the first A/D input terminal 61 with respect to the second key switch K12 to 0. The key-in microcomputer 91 sets the elements b(1,3) and b(1,4) of the bit array corresponding to the third and fourth key switches K13 and K14, which are connected to the first A/D input terminal 61 while located farther away from the first A/D input terminal 61 with respect to the second key switch K12 to the previously-converted value, for example, 0 (K13) and 1 (K14). Thus, the key-in microcomputer 91 converts the on or off states of the four key switches into the bit array b(1,1) to b(1,4)=0101.

Processing operation of the key-in microcomputer 91 during the conversion of the on or off states of the key switches K into the bit array will be described below with reference to a flowchart in FIG. 4. The key-in microcomputer 91 sets a variable y corresponding to a yth A/D input terminal to 1 (S1). The key-in microcomputer 91 converts the on or off state of the key switch K connected to the yth A/D input terminal into the bit array (S2). In the first-time processing in S2, the on or off states of the key switches K11 to K14 connected to the first A/D input terminal 61 are converted into the bit array. The key-in microcomputer 91 determines whether the variable y is 4 (S3). In the case of determining that the variable y is not 4 (No in S3), the key-in microcomputer 91 increases the variable y by 1 (S4). This is because the on or off states of the key switches K connected to the next yth A/D input terminal are converted into the bit array in the next processing in S2. After the processing S4, the key-in microcomputer 91 performs the processing S2. In the case of determining that the variable y is 4 (Yes in S3), the key-in microcomputer 91 outputs the bit array b(1,1) to b(4,4) to the key processing microcomputer 2 (S5) because the on or off states of all the key switches K are converted into the bit array.

Processing operation of the key-in microcomputer 91 during the conversion of the on or off states of the key switches K connected to one A/D input terminal into one bit array will be described below with reference to a flowchart in FIG. 5. The case that the key-in microcomputer 91 converts the on or off states of the key switches Ky1 to Ky4 connected to the yth A/D input terminal into one bit array will be described. The key-in microcomputer 91 performs the A/D conversion of the yth A/D input terminal, and reads the A/D-converted value (S11). The key-in microcomputer 91 converts the read A/D-converted value into the key number (0 to 4) corresponding to the A/D-converted value (S12, see FIG. 3). The key-in microcomputer 91 sets the variable k to the converted key number (S13). The key-in microcomputer 91 determines whether the variable k is 0 (S14). That is, the key-in microcomputer 91 determines whether all the key switches Ky1 to y4 are in the off state. In the case of determining that the variable k is 0, namely, that all the key switches Ky1 to y4 are in the off state (Yes in S14), the key-in microcomputer 91 sets a variable x corresponding to a column number of the key switches Ky1 to Ky4 to 1 (S15). The key-in microcomputer 91 sets an element b(y, x) of the bit array to 0 (S16). In the first-time processing in S16, because of the variable x=1, the element b(y,1) of the bit array becomes 0. The key-in microcomputer 91 determines whether the variable x is 4 (S17). In the case of determining that the variable x is not 4 (No in S17), the key-in microcomputer 91 increases the variable x by 1 (S18). This is because the element b(y,x) of the bit array in which the column number is larger than that of the element b(y,1) of the bit array is set to 0 in the processing from the second time.

In the case of determining that the variable x is not 4 (No in S17), the key-in microcomputer 91 repeatedly performs the pieces of processing in S16 to 18. Accordingly, all the elements b (y, 1) to b (y, 4) of the bit array corresponding to the on or off states of the key switches Ky1 to Ky4 connected to the yth A/D input terminal become 0. In the case of determining that the variable x is 4 (Yes in S17), the key-in microcomputer 91 ends the processing.

On the other hand, in the case of determining that the variable k is not 0, namely, that any key switches Ky1 to Ky4 are in the on state (No in S14), the key-in microcomputer 91 sets the variable x corresponding to the column number of the key switches Ky1 to Ky4 to 1 (S19). The key-in microcomputer 91 determines whether the variable x is k (key number) (S20). That is, the key-in microcomputer 91 determines whether the key switch Kyx is in the on state. In the case of determining that the variable x is not k, namely, that the key switch Kyx is not in the on state (is in the off state) (No in S20), the key-in microcomputer 91 sets the element b(y,x) of the bit array to (S21). In the first-time processing S21, because of the variable x=1, the element b(y,1) of the bit array becomes 0. The key-in microcomputer 91 increases the variable x by 1 (S22). This is because whether the key switch Kyx corresponding to the next column number is in the on state is determined in the next processing in S20. After the processing S22, the key-in microcomputer 91 performs the processing S20.

On the other hand, in the case of determining that the variable x is k, namely, that the key switch Kyx is in the on state (Yes in S23), the key-in microcomputer 91 sets the element b(y,x) of the bit array to 1 (S23), and ends the processing. At this point, for example, in the case that the determination that the variable x is k, namely, that the key switch Ky1 is in the on state is made in the first-time processing S20, the element b(y,1) of the bit array becomes 1, and the processing is ended. Accordingly, the elements b(y,2) to b(y,4) of the bit array corresponding to the key switches Ky2 to Ky4, which are connected to the yth A/D input terminal while located farther away from the yth A/D input terminal with respect to the key switch Ky1, remain in the previously-converted values. For example, in the case that the determination that the variable x is k, namely, that the key switch Ky2 is in the on state is made in the second-time processing S20, the element b(y,1) of the bit array becomes 0, the element b(y,2) of the bit array becomes 1, and the processing is ended. Accordingly, the elements b(y,3) to b(y,4) of the bit array corresponding to the key switches Ky3 to Ky4, which are connected to the yth A/D input terminal while located farther away from the yth A/D input terminal with respect to the key switch Ky2, remain in the previously-converted values.

As described above, in the embodiment, the key-in microcomputer 91 detects the on or off states of the plural key switches K11 to K44 based on the voltages at the A/D input terminals 61 to 64. The key-in microcomputer 91 converts the detected on or off states of the plural key switches K11 to K44 into the bit array. The key processing microcomputer 2 performs the processing based on the bit array converted by the key-in microcomputer 91. Therefore, it is not necessary to change the processing of the key processing microcomputer 2 even in the matrix-system input device provided with the key-in microcomputer that outputs the bit array.

In the embodiment, the key-in microcomputer 91 converts the on or off states of the plural key switches K connected to one A/D input terminal into one bit array. Accordingly, the independent bit array can be produced in each plural key switches connected to one A/D input terminal.

In the conventional input device of the A/D system, when the key switch, which is connected to the A/D input terminal while located closer to the A/D input terminal, is put into the on state in first in the key switches connected to the A/D input terminal, the key-in microcomputer can hardly detect the on or off state of the key switch, which is connected to the A/D input terminal while located farther away from the A/D input terminal with respect to the key switch. Therefore, the key-in microcomputer can hardly convert the on or off state of the key switch into the bit array.

In the embodiment, the key-in microcomputer 91 sets the element of the bit array corresponding to the key switch in which the on state is detected to 1. The key-in microcomputer 91 sets an element of the bit array corresponding to the key switch K, which is connected to each of the A/D input terminals 61 to 64 while located closer to each of the A/D input terminals 61 to 64 with respect to the key switch K in which the on state is detected to 0. The key-in microcomputer 91 sets the element of the bit array corresponding to the key switch K, which is connected to each of the A/D input terminals 61 to 64 while located farther away from each of the A/D input terminals 61 to 64 with respect to the key switch K in which the on state is detected, to the previously-converted value (for example, the value of 0 for the previously-converted value of 0, and the value of 1 for the previously-converted value of 1).

Therefore, the on or off state of the key switch K can be converted into the bit array in the input device 1 of the A/D system.

Although the embodiment of the present invention is described above, the applicable mode of the present invention is not limited to the embodiment. As described below, various changes can properly be made without departing from the scope of the present invention.

Figure 6:
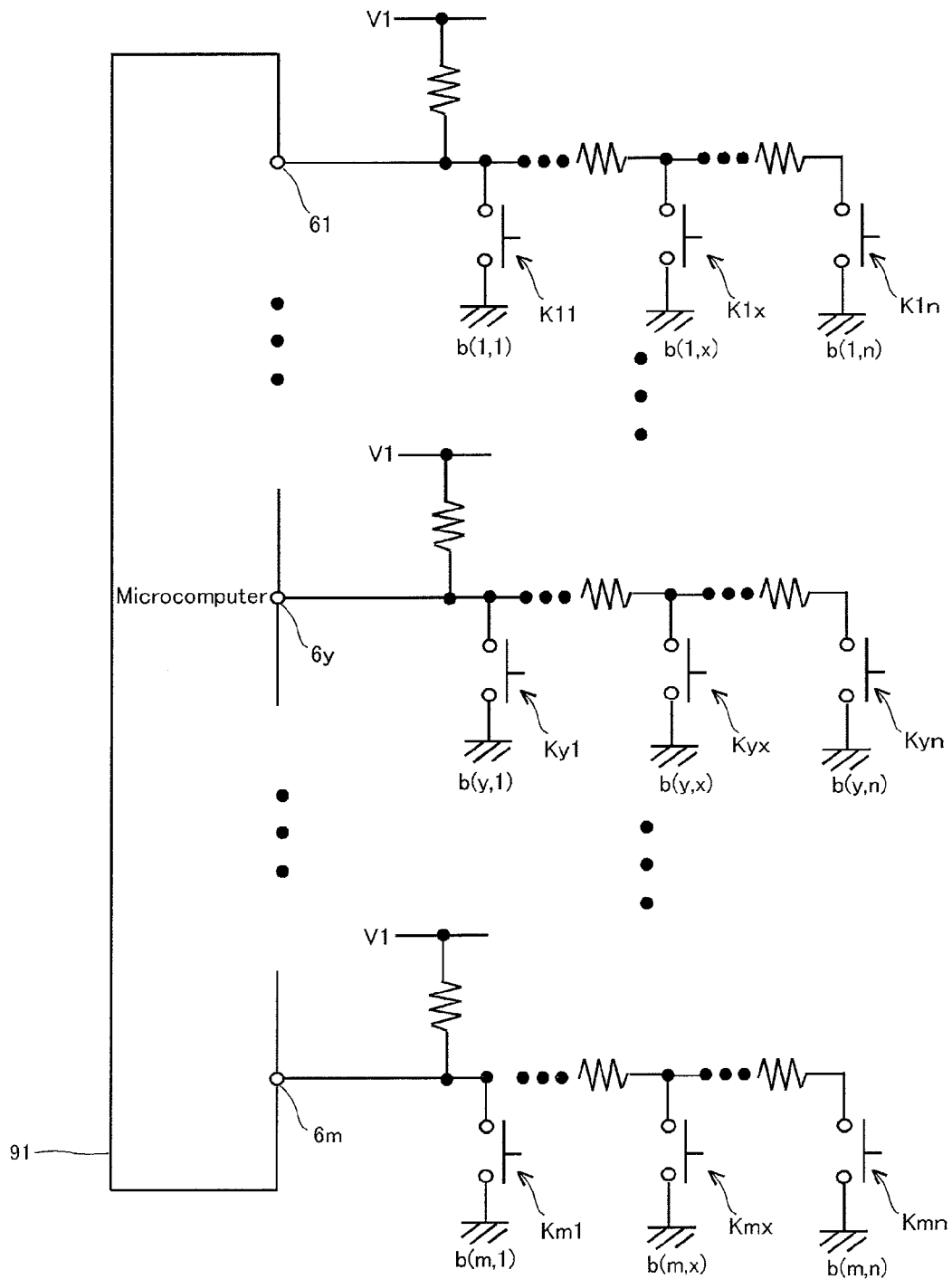
FIG. 6 is a view illustrating connection between the key-in microcomputer and the key switch in a modification.

In the embodiment, by way of example, the input device 10 includes the 4-by-4 key switches K11 to K44. Alternatively, as illustrated in FIG. 6, the number of key switches K may be m-by-n key switches (m is a natural number of 1 or more and n is a natural number of 3 or more). In this case, the key-in microcomputer 91 includes m A/D input terminals 61 to 6m.

Figure 4:
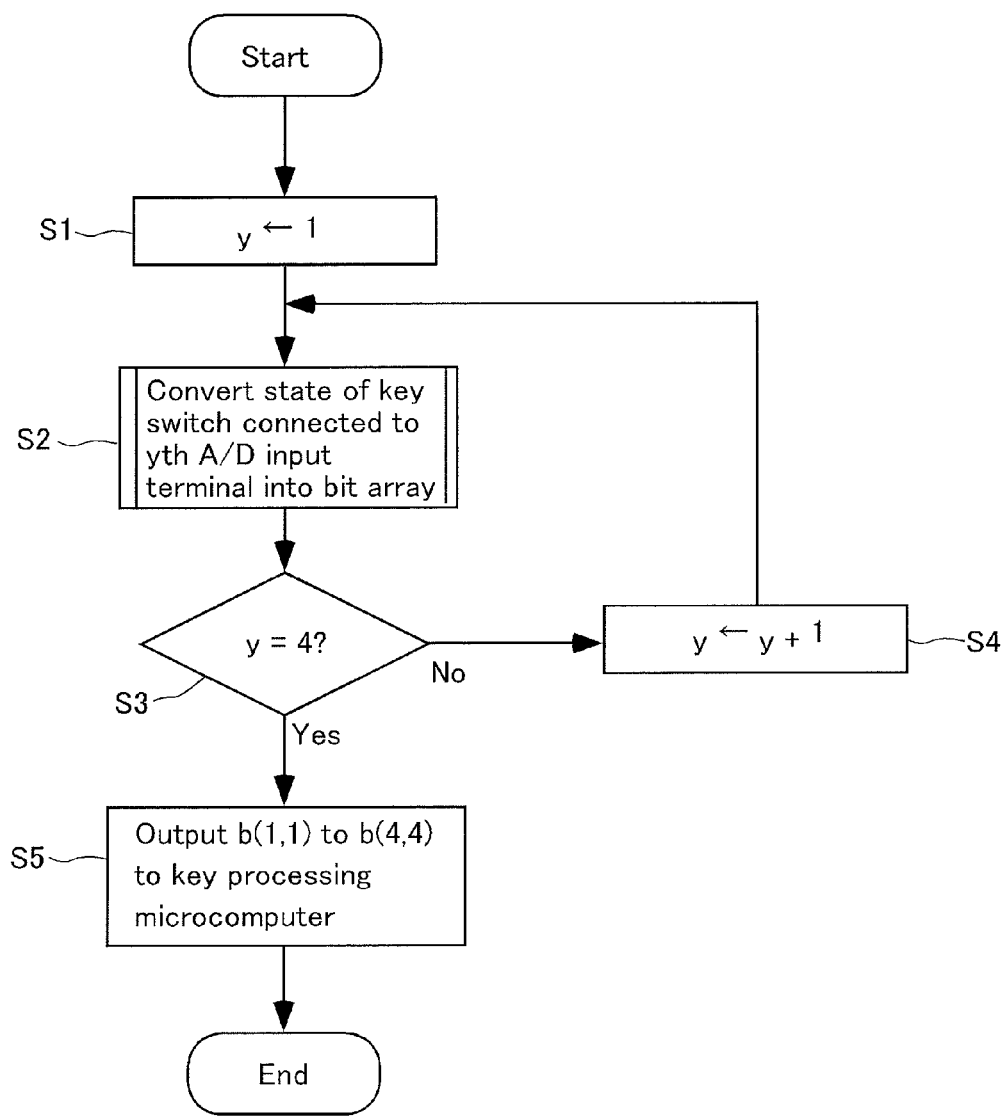
FIG. 4 is a flowchart illustrating processing operation of the key-in microcomputer in the case that an on or off state of the key switch is converted into a bit array.
Figure 7:
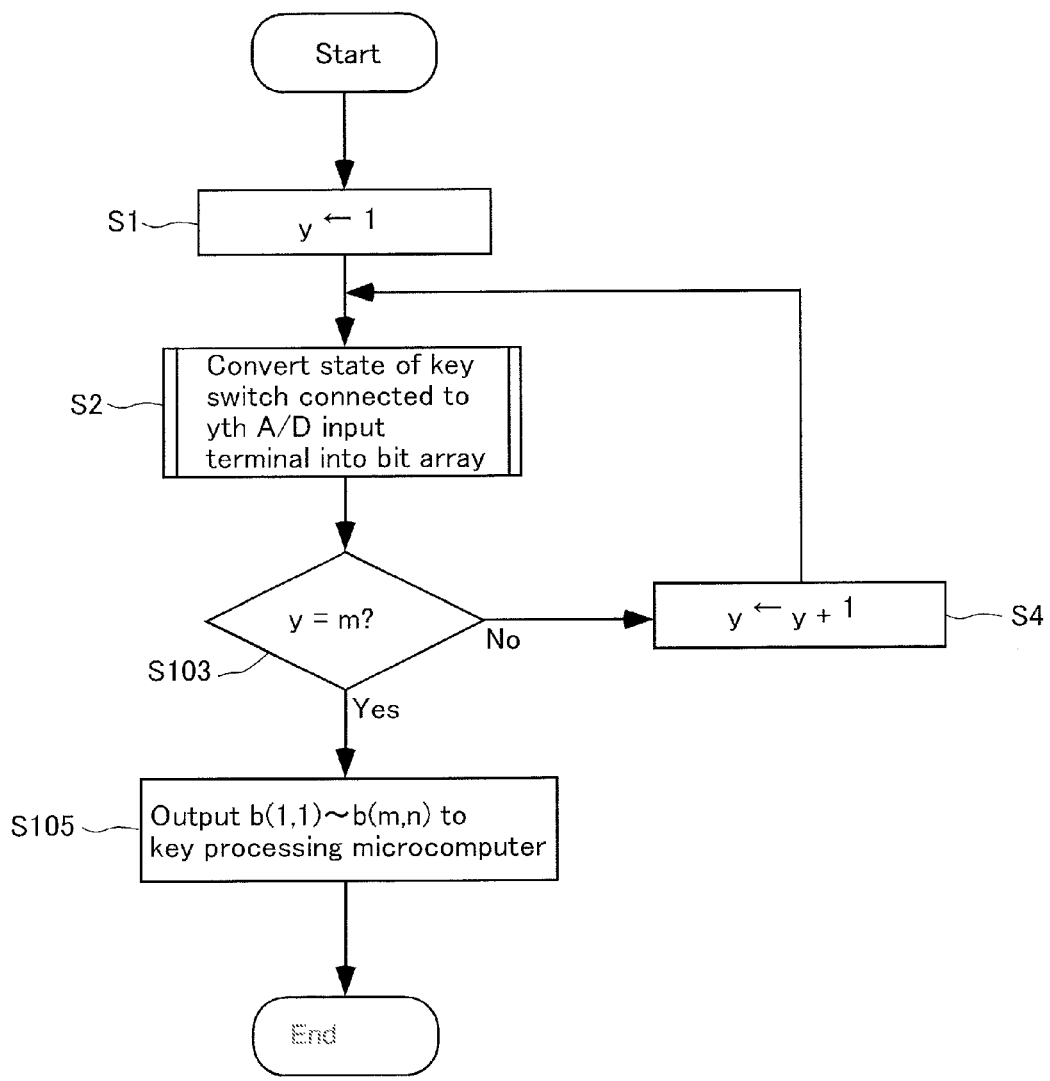
FIG. 7 is a flowchart illustrating processing operation of the key-in microcomputer in the case that an on or off state of the key switch is converted into a bit array in a modification.

For the configuration in FIG. 6, in the case that the on or off state of the key switch K is converted into the bit array, the key-in microcomputer 91 determines whether the variable y is m as illustrated in FIG. 7 instead of the processing in S3 of FIG. 4 (S103). This is because the on or off states of the key switches K are converted into the bit array up to key switches Km1 to Kmn connected to an mth A/D input terminal 6m. As illustrated in FIG. 7, the key-in microcomputer 91 outputs the bit array b(1,1) to b(m,n) to the key processing microcomputer 2 instead of the processing in S5 of FIG. 4 (S105).

Figure 5:
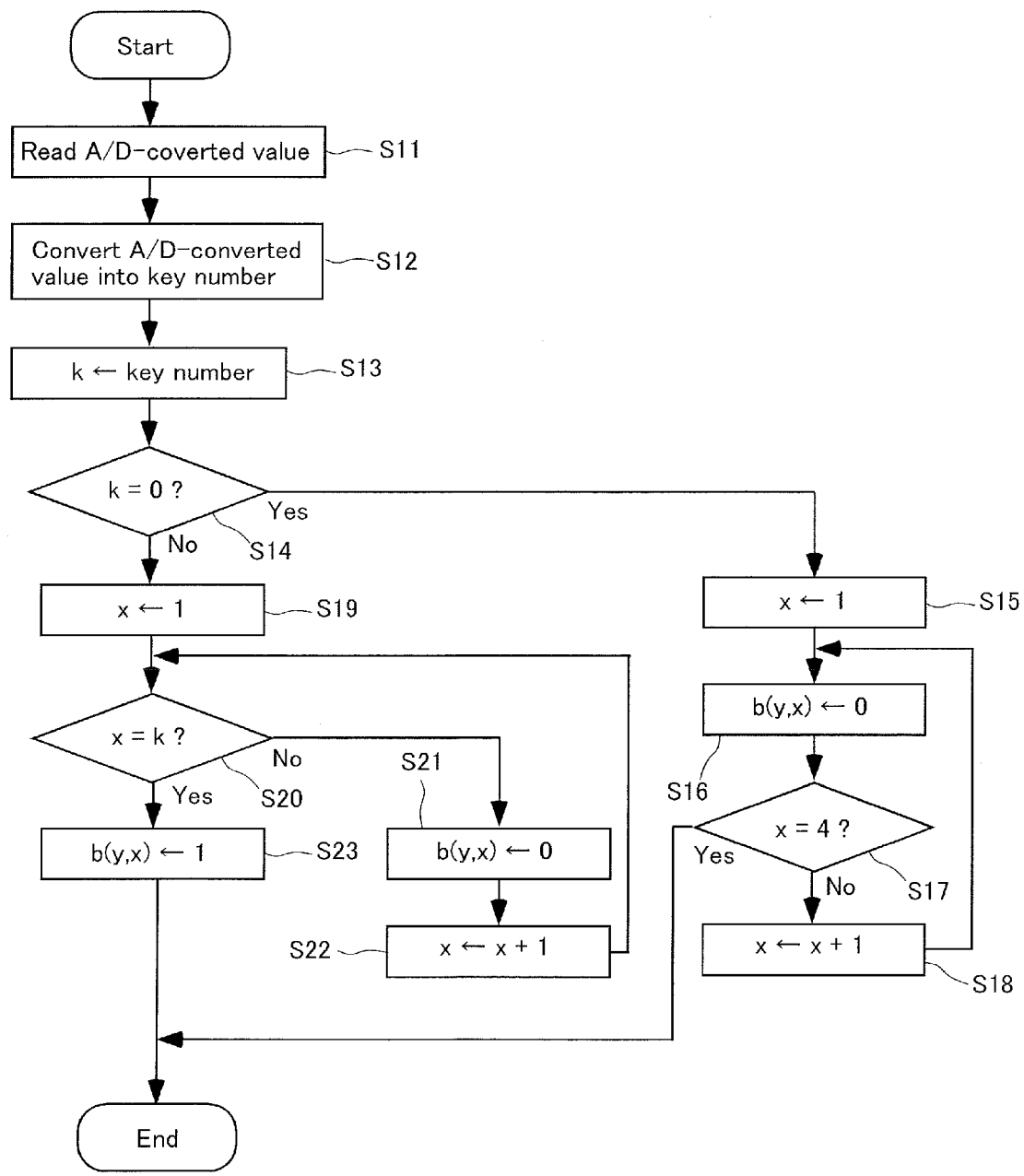
FIG. 5 is a flowchart illustrating processing operation of the key-in microcomputer in the case that the key switch connected to one A/D input terminal is converted into one bit array.
Figure 8:
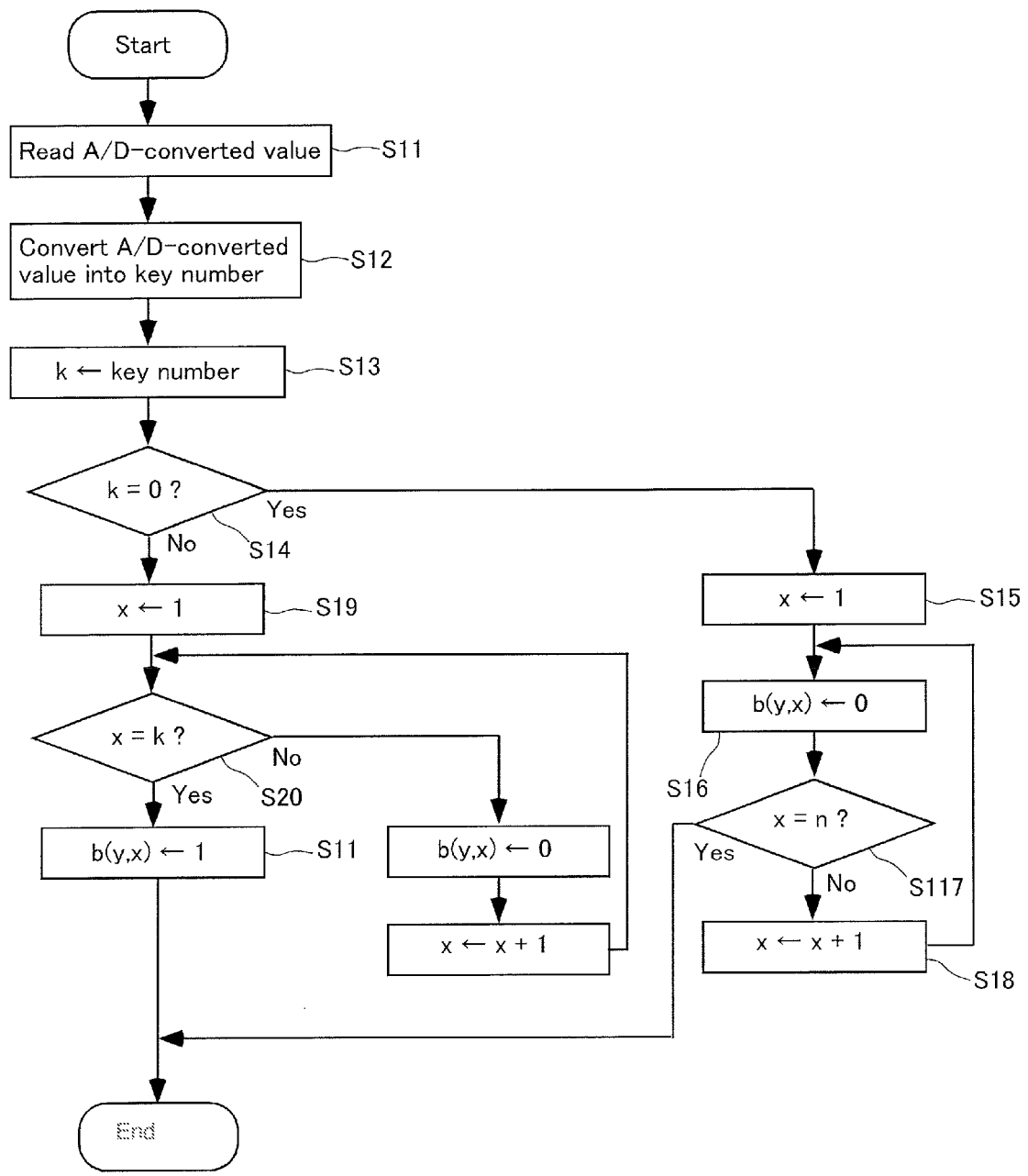
FIG. 8 is a flowchart illustrating processing operation of the key-in microcomputer in the case that the key switch connected to one A/D input terminal is converted into one bit array in a modification.
Figure 9:
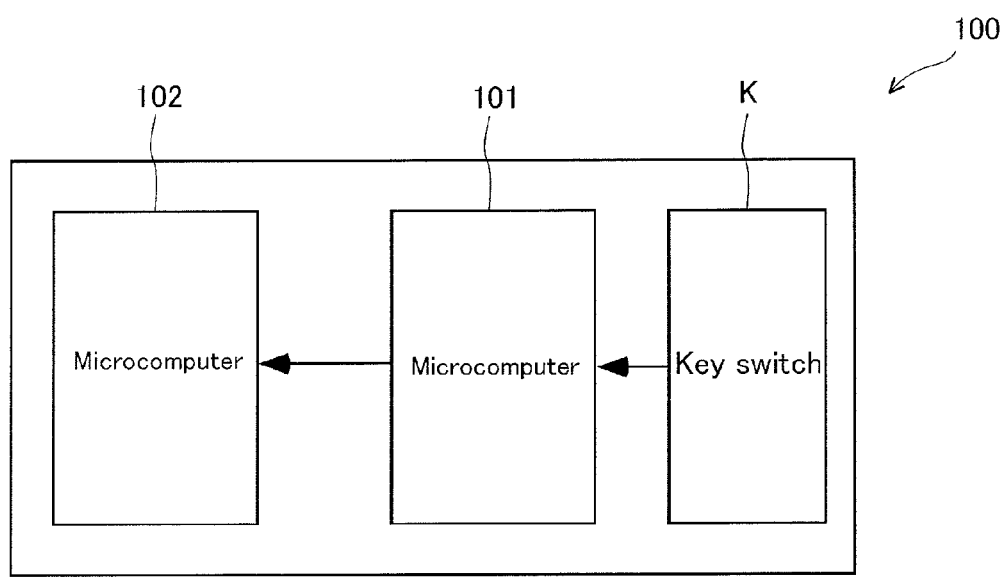
FIG. 9 is a block diagram illustrating a configuration of a conventional input device.
Figure 10:
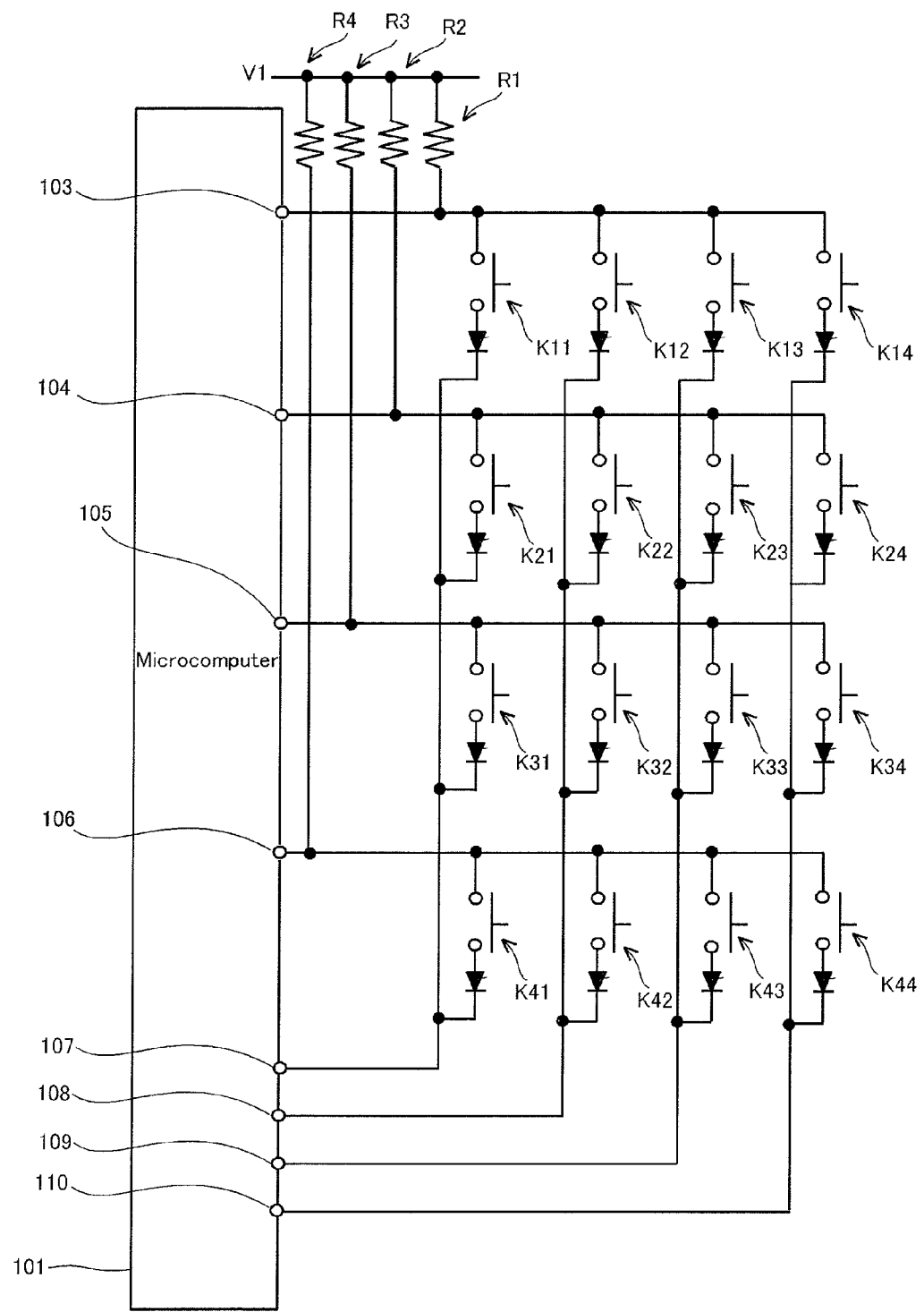
FIG. 10 is a view explaining a matrix system.
Figure 11:
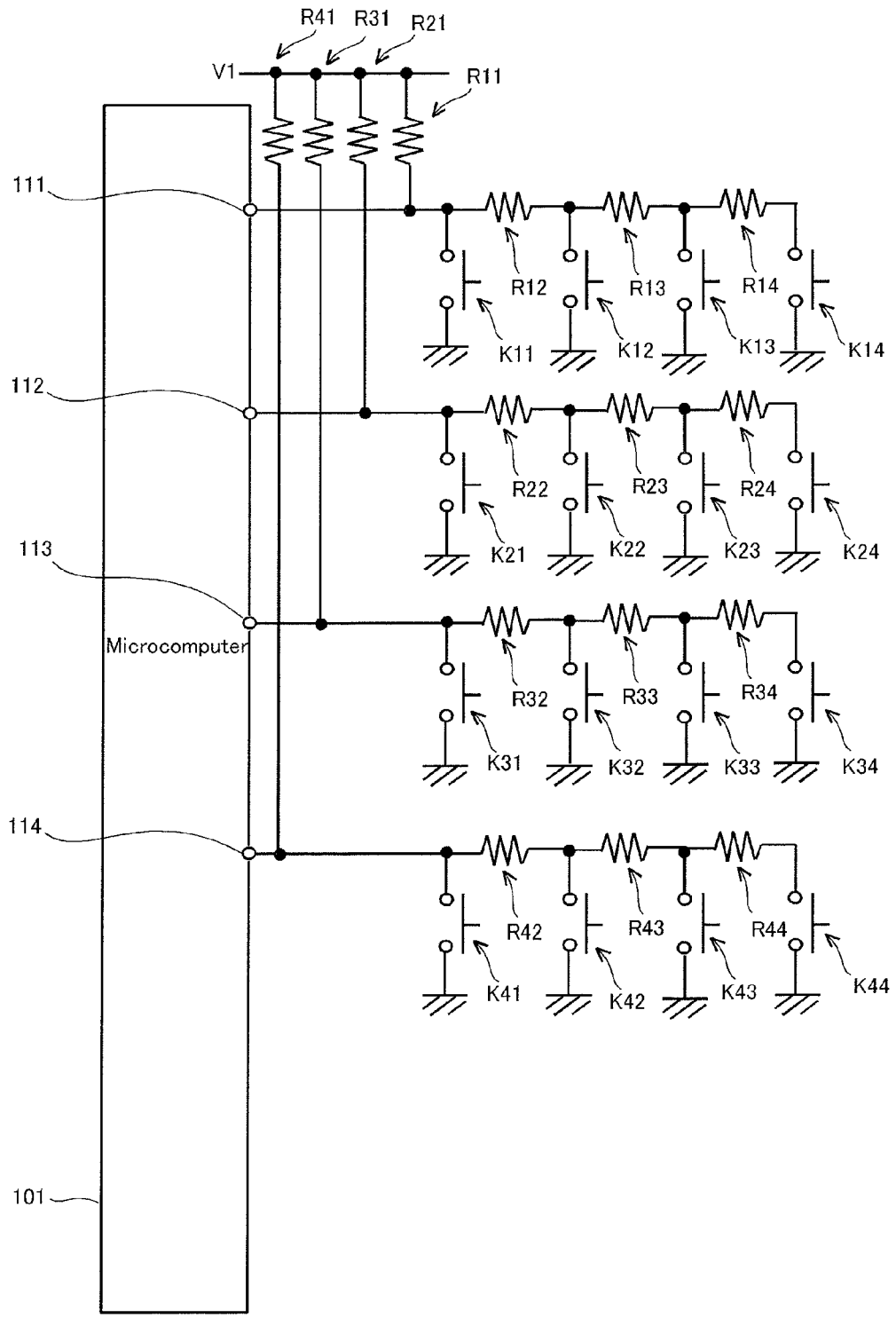
FIG. 11 is a view explaining an A/D system.
Figure 13:
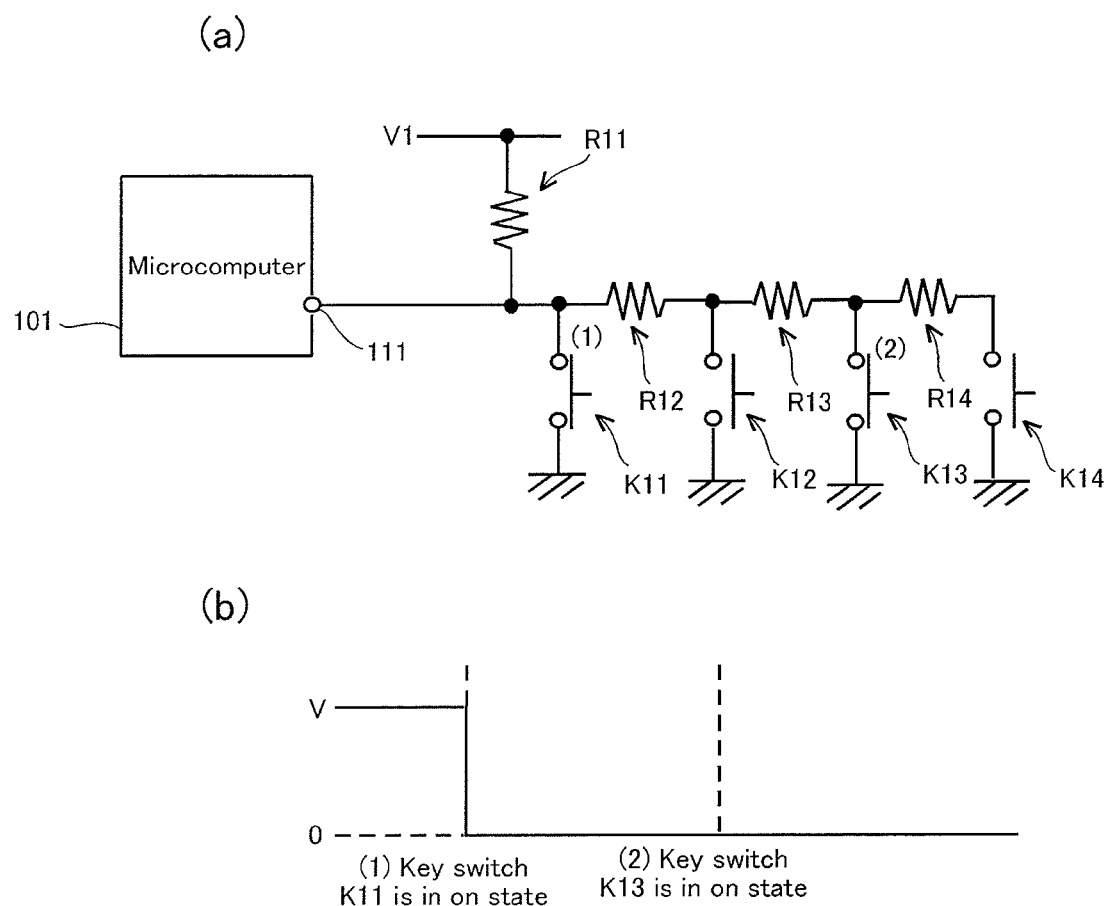
FIG. 13 is a view explaining an example in which, when plural key switches connected to an identical A/D terminal are simultaneously in the on state, which key switch is put into the on state cannot be detected.
Figure 14:
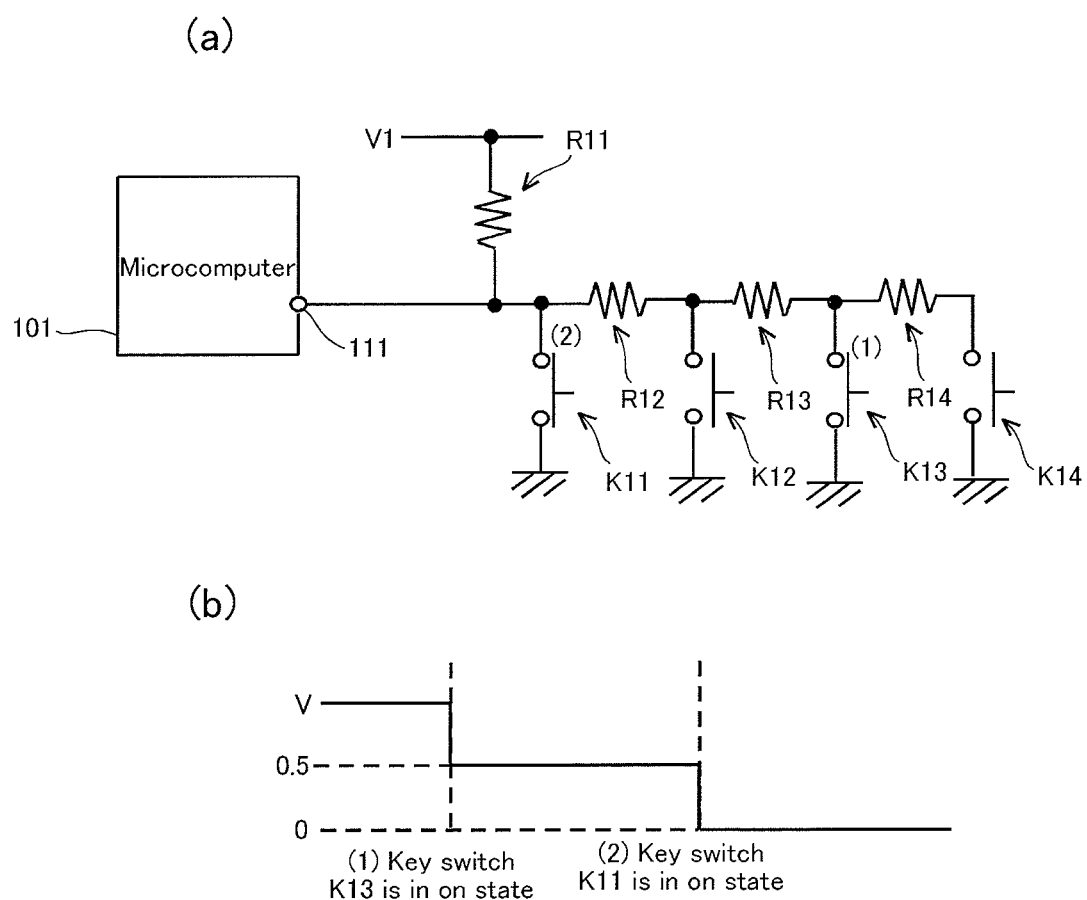
FIG. 14 is a view explaining an example in which, when the plural key switches connected to the identical A/D terminal are simultaneously in the on state, which key switch is put into the on state can be detected.

For the configuration in FIG. 6, in the case that the on or off states of the key switches K connected to one A/D input terminal is converted into one bit array, the key-in microcomputer 91 determines whether the variable x is n as illustrated in FIG. 8 instead of the processing in S17 of FIG. 5 (S117). This is because the elements of the bit array corresponding to the key switch Kyx are set to 0 up to the key switch Kyn having the column number n.

In the embodiment, the key-in microcomputer 91 and the key processing microcomputer 2 are separated from each other. Alternatively, one microcomputer may perform the processing performed by the key-in microcomputer 91 and the processing performed by the key processing microcomputer 2. That is, the independent program may cause the one microcomputer to act as the key-in unit (software module) that performs the processing performed by the key-in microcomputer 91 and the key processor (software module) that performs the processing performed by the key processing microcomputer 2.

In the embodiment, the input device of the present invention is applied to the CD player by way of example. Additionally, the input device of the present invention can be applied to AV equipment such as a DVD player, an HDD player, and an AV amplifier, home electric appliances, and electronic instruments such as a PC.

For example, the present invention can suitably be applied to the input device incorporated in electronic instruments such as the AV equipment and the PC.

What is claimed is:

1. An input device comprising: a plurality of key switches in each of which one end is connected to a terminal while the other end is grounded;
    a first resistor in which one end is connected between the terminal and the key switch while the other end is connected to a power supply, the key switch beings connected to the terminal while located closest to the terminal in the plurality of key switches;
    a plurality of second resistors each of which is connected between the two key switches adjacent to each other in the plurality of key switches;
    a key-in unit that detects an on or off states of each of the plurality of key switches based on voltage at the terminal, and converts the detected on or off state of each of the plurality of key switches into a bit array by setting the detected on or off state of each of the plurality of key switches to an element 0 or 1 respectively; and a key processor that performs processing based on the bit array converted by the key-in unit.

2. The input device according to claim 1, wherein the plurality of the key switches are connected to each of the plurality of the terminals, and the key-in unit converts the one or off states of the plurality of key switches connected to the one terminal into one bit array.

3. The input device according to claim 1, wherein:

in the case that the voltage at the terminal changes from a power supply voltage to a threshold voltage associated with a particular one of the plurality of key switches being put into an on state, the key-in unit detects that the particular key switch is put into the on state, sets an element of the bit array corresponding to the particular key switch to 1, and with respect to the remaining plurality of key switches connected to the terminal, sets a corresponding element of the bit array for the remaining key switches which are located closer to the terminal relative to the particular key switch to 0, and sets a corresponding element of the bit array for the remaining key switches which are located farther away from the terminal relative to the particular key switch to their previously set value, and in the case that the voltage at the terminal is equal to the power supply voltage, the key-in unit detects the off states of the plurality of key switches, and sets the corresponding elements of the bit array for all the plurality of key switches to 0.

* * * * *